(12) United States Patent
Yoshimura

(10) Patent No.: US 8,558,986 B2
(45) Date of Patent: Oct. 15, 2013

(54) EXPOSURE APPARATUS AND DEVICE MANUFACTURING METHOD

(75) Inventor: Keiji Yoshimura, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 837 days.

(21) Appl. No.: 12/617,576

(22) Filed: Nov. 12, 2009

(65) Prior Publication Data

US 2010/0123884 A1    May 20, 2010

(30) Foreign Application Priority Data

Nov. 14, 2008    (JP) ................................ 2008-292606

(51) Int. Cl.
*G03B 27/68* (2006.01)

(52) U.S. Cl.
USPC ........................................................ 355/52

(58) Field of Classification Search
USPC .................................................... 355/52, 53
See application file for complete search history.

(56) References Cited

U.S. PATENT DOCUMENTS

| | | | |
|---|---|---|---|
| 6,118,515 A * | 9/2000 | Wakamoto et al. | 355/53 |
| 6,238,851 B1 * | 5/2001 | Nishi | 430/394 |
| 6,381,004 B1 * | 4/2002 | Hagiwara et al. | 355/53 |
| 6,426,508 B1 * | 7/2002 | Kosugi et al. | 250/548 |
| 6,674,510 B1 | 1/2004 | Jasper et al. | |
| 6,882,405 B2 | 4/2005 | Jasper et al. | |
| 6,924,884 B2 | 8/2005 | Boonman et al. | |
| 7,019,815 B2 | 3/2006 | Jasper et al. | |
| 7,116,401 B2 | 10/2006 | Nijmeijer et al. | |
| 7,202,938 B2 | 4/2007 | Modderman et al. | |
| 7,206,058 B2 | 4/2007 | Modderman et al. | |
| 7,239,371 B2 * | 7/2007 | Liegl et al. | 355/55 |
| 7,649,635 B2 * | 1/2010 | Schoonewelle et al. | 356/601 |
| 7,940,374 B2 * | 5/2011 | Lyons | 355/55 |
| 8,107,052 B2 * | 1/2012 | Kosugi | 355/53 |
| 2005/0128454 A1 * | 6/2005 | Ina | 355/55 |
| 2007/0229788 A1 * | 10/2007 | Kosugi | 355/53 |
| 2009/0009739 A1 * | 1/2009 | Kosugi | 355/53 |
| 2010/0002218 A1 * | 1/2010 | Kosugi | 355/67 |

FOREIGN PATENT DOCUMENTS

| | | |
|---|---|---|
| JP | 2000-323404 A | 11/2000 |
| JP | 2001-168024 A | 6/2001 |
| JP | 2005-175334 A | 6/2005 |

* cited by examiner

*Primary Examiner* — Peter B Kim
*Assistant Examiner* — Deoram Persaud
(74) *Attorney, Agent, or Firm* — Canon U.S.A., Inc. IP Division

(57) ABSTRACT

An apparatus comprises a controller configured to generate a first list of measurement points arranged symmetrically with respect to a center of a shot region along a direction of scanning at a predetermined pitch, and a control by the controller includes a first control which causes a measurement device to measure a position of a surface with respect to each measurement point included in the first list, and a second control which causes the measurement device to measure the position with respect to each measurement point included in a second list obtained by excluding, from the first list, at least one of a measurement point with respect to which measurement is performed last in a first shot region and a measurement point with respect to which measurement is performed first in a second shot region next to the first shot region.

3 Claims, 9 Drawing Sheets

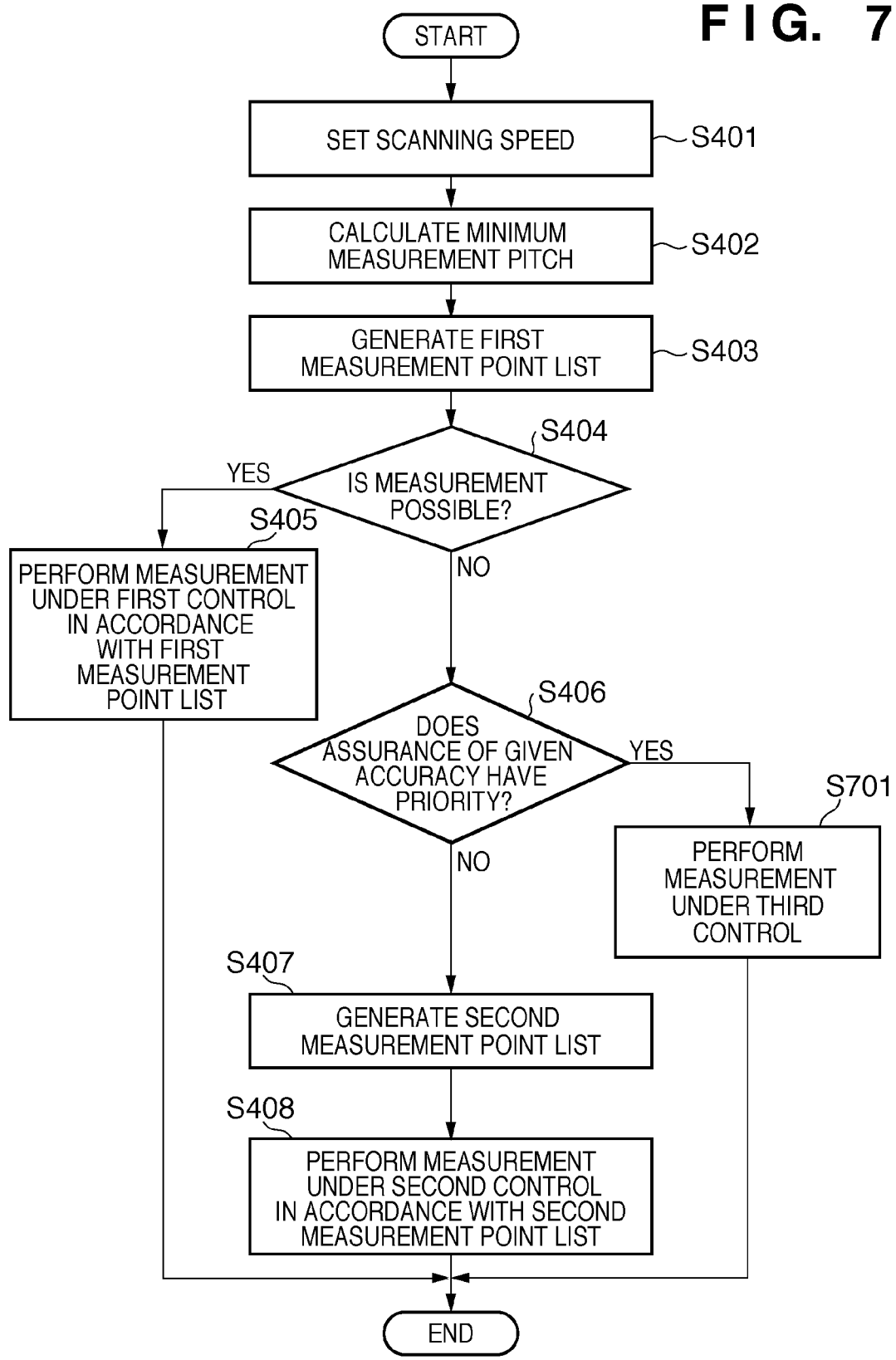

EXPOSURE APPARATUS AND DEVICE MANUFACTURING METHOD

BACKGROUND OF THE INVENTION

1. Field of the Invention

The present invention relates to an exposure apparatus which exposes a substrate to light via a projection optical system, and a method of manufacturing a device using the exposure apparatus.

2. Description of the Related Art

Exposure apparatuses for transferring the patterns of originals (reticles) onto substrates (wafers) are classified into a single-stage type and a twin-stage type that differ in the number of stages which hold substrates (Japanese Patent Laid-Open No. 2000-323404).

A single-stage type exposure apparatus can perform substrate surface shape (surface position) measurement (to be referred to as focus measurement hereinafter) for focus control, immediately before exposure in each shot or in parallel with exposure in each shot. FIG. 2A schematically shows exposure and focus measurement in a single-stage type exposure apparatus. Referring to FIG. 2A, the layout (shot layout) of shot regions 202A is defined for a substrate 201A. A single-stage type scanning exposure apparatus (scanner), for example, performs focus measurement in parallel with exposure in a first shot region 203, and performs focus measurement again in parallel with exposure in a second shot region 204. An exposure apparatus of the stepper type performs focus measurement immediately before exposure in each shot.

A twin-stage type exposure apparatus measures, e.g., undulations and strain of a substrate in a measurement station, and uses the obtained measurement result in exposing the substrate in an exposure station. Hence, the twin-stage type exposure apparatus can measure the above-mentioned characteristics of the substrate surface free from any limitations imposed on the substrate by the shot layout. The twin-stage type exposure apparatus typically successively measures the surface shapes of a substrate in a plurality of shot regions while scanning the substrate. This method is commonly called column measurement. FIG. 2B schematically shows exposure and focus measurement in a twin-stage type exposure apparatus. Referring to FIG. 2B, the layout (shot layout) of shot regions 202B is defined for a substrate 201B. The twin-stage type exposure apparatus performs column measurement 205 of the first column, and then performs column measurement 206 of the second column.

To determine the surface shape of a substrate having a pattern, one general method is to calculate the characteristics of the substrate surface by taking account of (by eliminating) pattern undulations. Referring to FIG. 5A, the surface shapes of a substrate having pattern undulations 501A are measured in measurement regions 502A, 503A, and 504A. Focus measurement operations 505 and 506 at a plurality of positions in the measurement regions 502A, 503A, and 504A will be considered. In this case, if the measurement values are used directly, the substrate is exposed upon being erroneously regarded as having surfaces 507A, 508A, and 509A.

To prevent this, pattern undulations are measured in advance and used as an offset (pattern offset). With this operation, the surface of the substrate having the pattern undulations 501A (that are measured in measurement regions 502B, 503B, and 504B) can be positioned with respect to a reference plane 510 (the image plane of a projection optical system), as shown in FIG. 5B.

Also, the mainstream stage control and focus measurement employ separate processors because of factors associated with a processing load. Therefore, it is a common practice to perform focus measurement while driving the stage by detecting the stage position once, and thereafter performing sampling and measurement at a predetermined time interval by the focus processor. For example, as shown in FIG. 5C, focus measurement in scanning exposure of shot regions 511, 512, and 513 in the directions indicated by arrows is started from, e.g., measurement regions 502C of 502C, 503C and 504C, 504D of 502D, 503D and 504D, and 502E of 502E, 503E and 504E, respectively, to measure the surface positions at positions having the same underlying portions among the shot regions 511, 512, and 513.

In column measurement for successively measuring a plurality of shot regions, the shot layout pitch cannot always be divided by a sampling pitch, which is determined by the sampling timing, without a remainder. In this respect, the focus measurement position may differ for each shot region. For example, as shown in FIG. 5D, two layouts 517A and 517B having shot regions with different lengths in the scanning direction will be considered. In a layout 514A, the layout pitch of shot regions is an integer multiple of the sampling pitch. In a layout 514B, the layout pitch of shot regions is not an integer multiple of the sampling pitch. The layout 517A allows surface position measurement at identical measurement points throughout all shot regions. In contrast to this, the layout 517B does not allow measurement points in each shot region to be identical throughout all shot regions. It is therefore hard to calculate and use a pattern offset in a case like the layout 517B.

SUMMARY OF THE INVENTION

One of the aspect of the present invention provides an apparatus which includes a projection optical system, a stage configured to hold a substrate, and a measurement device configured to measure a position of a surface of the substrate in a direction of an optical axis of the projection optical system; measures the position with respect to each of a plurality of shot regions arrayed on the substrate by scanning the plurality of shot regions relative to the measurement device; and moves the stage in accordance with the measured position and exposes each of the plurality of shot regions to light via the projection optical system, the apparatus comprising a controller configured to control the stage and the measurement device, wherein the controller is configured to generate a first list of measurement points arranged symmetrically with respect to a center of a shot region along a direction of the scanning at a predetermined pitch, and the controller includes a first control which causes the measurement device to measure the position with respect to each of the measurement points included in the first list, and a second control which causes the measurement device to measure the position with respect to each of measurement points included in a second list obtained by excluding, from the first list, at least one of a measurement point with respect to which measurement is performed last in a first shot region and a measurement point with respect to which measurement is performed first in a second shot region next to the first shot region.

Further features of the present invention will become apparent from the following description of exemplary embodiments with reference to the attached drawings.

BRIEF DESCRIPTION OF THE DRAWINGS

FIG. 7 is a flowchart schematically showing focus measurement control by a main controller.

DESCRIPTION OF THE EMBODIMENTS

Embodiments of the present invention will be described below with reference to the accompanying drawings.

Figure 1:
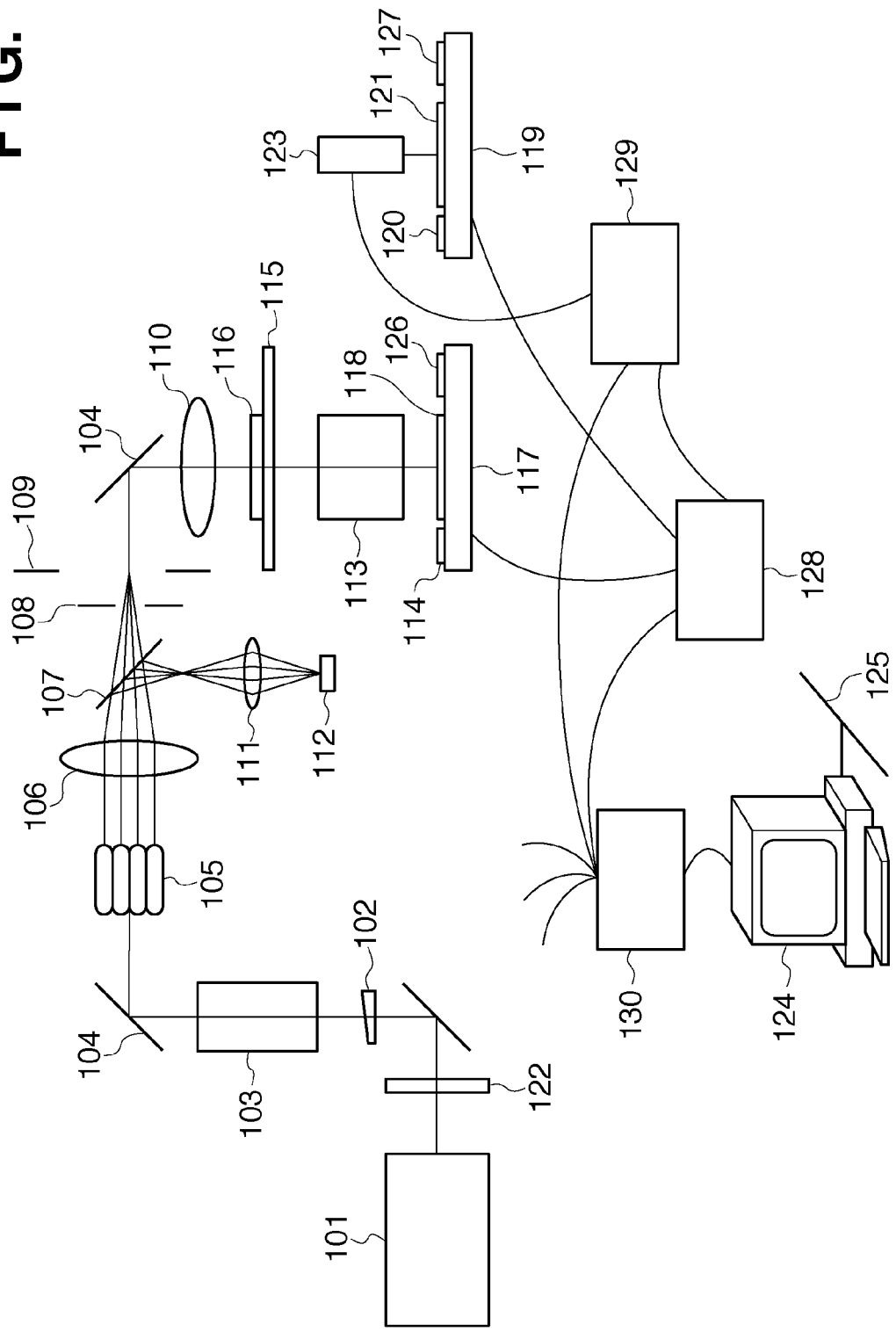
FIG. 1 is a view showing the schematic arrangement of an exposure apparatus according to an embodiment of the present invention.

FIG. 1 is a view showing the schematic arrangement of an exposure apparatus according to an embodiment of the present invention. A light source 101 is, for example, an excimer laser or an i-line lamp. Light emitted by the light source 101 reaches an optical member 122. The optical member 122 is used to attenuate the light intensity. The optical member 122 includes, for example, optical elements (e.g., ND filters) with a plurality of different attenuation ratios. The light having passed through the optical member 122 reaches an optical unit 102. The optical unit 102 reduces an illuminance variation by oscillating the angle of coherent light. The light having passed through the optical unit 102 enters a beam shaping optical system 103. The beam shaping optical system 103 shapes the sectional shape of light and converts it into incoherent light.

The light having passed through the beam shaping optical system 103 is reflected by a mirror 104 and enters a condenser lens 106 upon passing through an optical integrator 105. The condenser lens 106 illuminates a masking blade 109 with the light from a secondary light source formed by the optical integrator 105. The light having passed through the condenser lens 106 is partially extracted by a half mirror 107 and guided to a photodetector 112 via a condenser lens 111. The photodetector 112 is used to monitor the exposure dose on a substrate (wafer) 118 during its exposure.

The masking blade 109 includes, for example, four upper, lower, left, and right light-shielding plates which are driven independently. The masking blade 109 is located on a plane optically conjugate to an original (reticle) 116 with respect to an imaging lens 110. A slit member 108 includes, for example, a pair of light-shielding plates. The slit member 108 is set at a position shifted in the optical-axis direction from the plane on which the masking blade 109 is located. With this arrangement, the light having passed through the slit member 108 forms a light intensity distribution having a trapezoidal sectional shape. The imaging lens 110 illuminates the original 116 with the light having passed through the slit member 108 and masking blade 109 and having been reflected by a mirror 104.

A projection optical system 113 projects the pattern of the original 116 onto the substrate 118. An original stage 115 holds the original 116, and a substrate stage 117 holds the substrate 118. The original stage 115 and substrate stage 117 are driven while levitating by, e.g., air pads.

The photodetector 112 detects and controls the exposure dose on the substrate 118. The substrate stage 117 mounts an illuminometer 114. The photodetector 112 can monitor the exposure dose on the substrate 118 by examining the relationship between the detection results obtained by the illuminometer 114 and photodetector 112.

For various types of calibration such as position adjustment between the original stage 115 and the substrate stage 117, a fiducial mark 126 is located on the substrate stage 117.

This exposure apparatus includes two substrate stages 117 and 119. The positions of the two substrate stages 117 and 119 can be swapped for each other. A stage controller 128, for example, controls the substrate stages 117 and 119. The substrate stage 119 has basically the same arrangement as that of the substrate stage 117. The substrate stage 119 includes, for example, an illuminometer 120 and fiducial mark 127.

A scope (measurement device) 123 used for focus measurement and alignment measurement is located in a measurement station for focus measurement and alignment measurement. The scope 123 is also used to measure the amount of strain and the three-dimensional shape of a substrate 121. While the substrate held by the substrate stage 117 is exposed under the projection optical system 113, the one (the substrate to be exposed next) held by the substrate stage 119 is measured under the scope 123. After that, the substrate stage 119 is driven to a position below the projection optical system 113. Each shot region on the substrate held by the substrate stage 119 is exposed while being positioned in accordance with the measurement result obtained by the scope (measurement device) 123. A twin-stage type exposure apparatus achieves a high throughput by measuring the next substrate while one substrate is exposed.

A measurement controller 129 controls focus measurement and alignment measurement. A main controller 130 controls the stage controller 128 and measurement controller 129.

The stage controller 128 and measurement controller 129 are directly connected to each other such that an interrupt request can be issued for the processing in the measurement controller 129 in accordance with the position of the substrate stage 119. In response to the issued interrupt request, focus measurement is performed. Alternatively, focus measurement may be performed at the timing, when the substrate stage 119 reaches a target position, which is detected by referring to, by the measurement controller 129, the current position of the substrate stage 119 controlled by the stage controller 128. A time delay attributed to intervention of the main controller 130 can be minimized by directly connecting the stage controller 128 and measurement controller 129 to each other.

An exposure apparatus I/F 124 includes an input device (e.g., a keyboard and a mouse), and specifies the operation of the exposure apparatus in accordance with an instruction issued from the input device. Also, the exposure apparatus I/F 124 manages conditions such as the substrate exposure conditions and the shot layout (the layout of shot regions on the substrate). The operator operates the exposure apparatus under the conditions selected from the managed conditions.

The exposure apparatus I/F 124 is also connected to, e.g., a backbone network (e.g., a local network) 125 operated under the environment under which the exposure apparatus is installed. This enables the exposure apparatus I/F 124 to download the operation conditions of the exposure apparatus and the like from the backbone network 125.

The main controller 130 controls each unit of the exposure apparatus in accordance with an instruction issued from the operator or the network 125 via the exposure apparatus I/F 124.

Figure 2A:
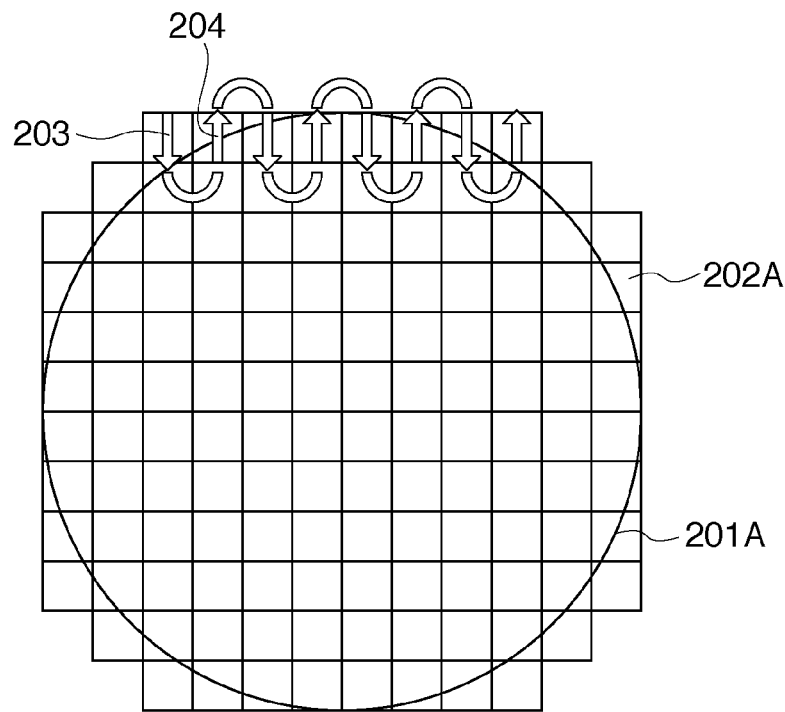
FIG. 2A is a view schematically showing a measurement sequence of shot regions on a substrate.
Figure 2B:
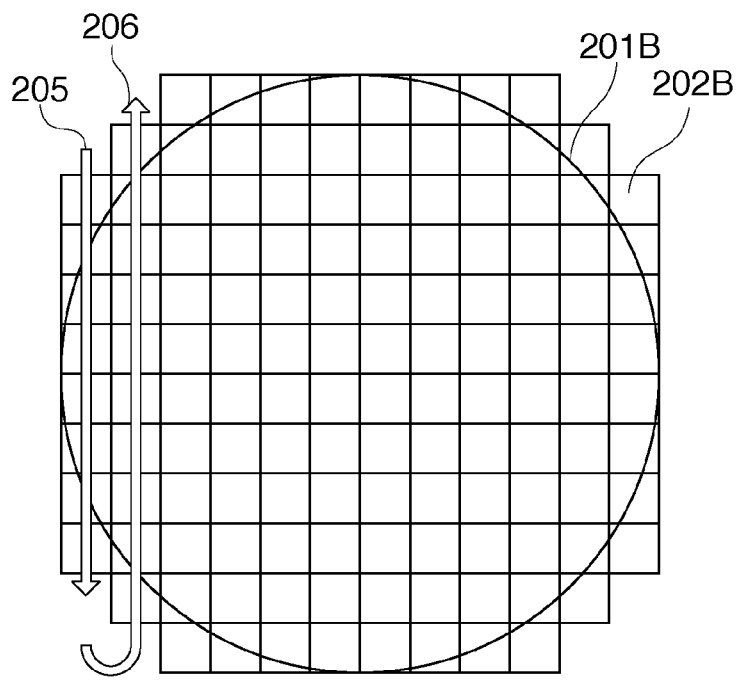
FIG. 2B is a view schematically showing another measurement sequence of shot regions on a substrate.

The items of measurement in the measurement station include, for example, measurement (alignment measurement) of the amount of strain of a substrate in a portion having a shot layout drawn, and measurement (focus measurement) of the substrate surface position (or surface shape). To utilize the benefits of a twin-stage system, such measurements is to be completed within a time shorter than the exposure time. Note that reciprocal movement of the original stage 115 is applied for each shot to expose the substrate in the exposure station, whereas the substrate surfaces can be successively measured along a straight line in the measurement station. More specifically, as illustrated in FIG. 2B, each column of the shot layout defined on the substrate 201B can be measured successively (column measurement). In the exposure station, the scanning speed may be adjusted in accordance with, e.g., the light intensity and the exposure dose. In contrast to this, the measurement in the measurement station is free from such a scanning speed limit, and therefore can be done at a maximum scanning speed.

When column measurement is performed at a predetermined sampling time interval, it is generally impossible to set the measurement points in each shot region to be identical throughout all shot regions, as described above. To combat this situation, the main controller 130 determines the measurement points, such that the surface positions are measured at identical measurement points throughout all shot regions, in accordance with the shot layout. A process for this determination will be referred to as a measurement point determination process hereinafter.

A measurement point determination process will be explained in detail with reference to FIGS. 3A to 3D. The main controller 130 locates central measurement points 315A and 316A at the positions of centers 313 and 314 of shot regions 311 and 312 in the scanning direction. Also, the main controller 130 determines a minimum sampling pitch as an optimal sampling pitch 317 based on, e.g., the processing times of the stage controller 128 and measurement controller 129, a time delay attributed to, e.g., the time taken for their mutual communication, and the upper limit of the scanning speed of the substrate stage. Note that the maximum scanning speed and the requirements for focus measurement change in accordance with the accuracy required by a recipe for substrate exposure control. Hence, the optimal sampling pitch 317 can be determined by taking account of these variable factors.

After that, the main controller 130 locates measurement points 315B, 315C, 316B, and 316C at a distance equal to the optimal sampling pitch 317 on the front and rear sides of the central measurement points 315A and 316A in the scanning direction. With this operation, a measurement point list including the measurement points 315B, 315A, 315C, 316B, 316A, and 316C is formed. A measurement point list generated in accordance with such a rule will be referred to as a first measurement point list hereinafter.

Figure 3A:
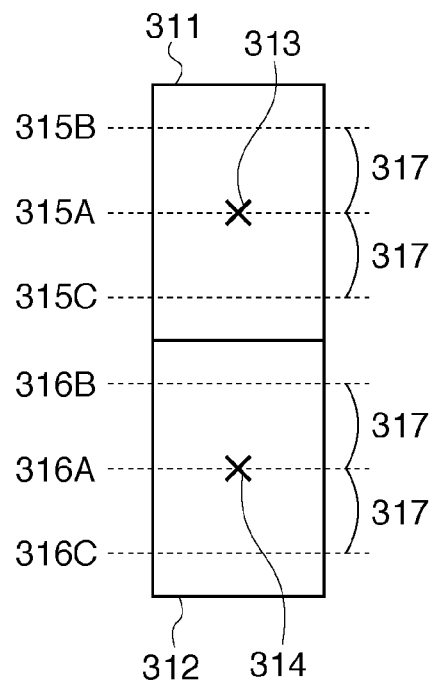
FIG. 3A is a view illustrating measurement points.
Figure 3B:
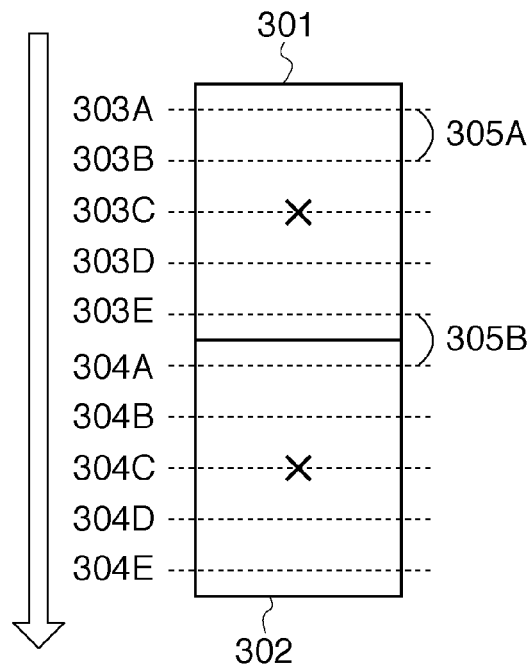
FIG. 3B is a view illustrating other measurement points.
Figure 3C:
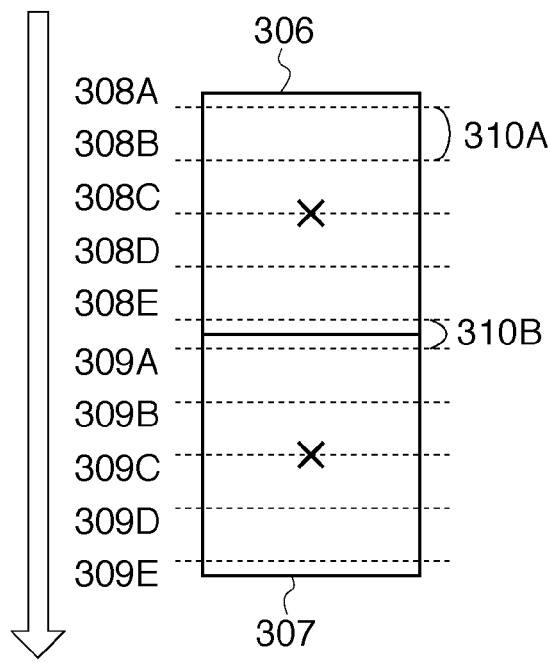
FIG. 3C is a view illustrating still other measurement points.

In some cases, focus measurement cannot be performed at all measurement points included in the first measurement point list. For example, column measurements shown in FIGS. 3B and 3C will be considered. FIG. 3B shows a case in which shot regions 301 and 302 are measured successively. FIG. 3C shows a case in which shot regions 306 and 307 are measured successively. The shot region 301 is measured at an optimal sampling pitch 305A as exemplified by the pitch of measurement points 303A to 303E. After the last measurement in the shot region 301 is performed at the last measurement point 303E, the first measurement in the next shot region 302 is performed at a first measurement point 304A across a distance 305B, and subsequent measurements in the shot region 302 are performed at measurement points 304B to 304E. At this time, the measurement is possible when the distance 305B between the measurement points 303E and 304A is larger than a minimum pitch in focus measurement, that is a minimum measurement pitch (predetermined pitch). In such a case, the main controller 130 controls the measurement controller 129 to perform measurement at all measurement points included in the first measurement point list. The above-mentioned control of the measurement controller 129 by the main controller 130 will be referred to as first control hereinafter.

In the example shown in FIG. 3C, measurement is performed at measurement points 308A to 308E in the shot region 306 at a measurement pitch 310A. After the measurement at the measurement point 308E, measurement is to be performed at a measurement point 309A in the next shot region 307 across a distance 310B. However, because the distance 310B is smaller than the minimum measurement pitch (predetermined pitch), measurement at the measurement point 309A is in fact impossible. If it is determined in the measurement point determination process that such a situation is expected to occur, second or third control is performed selectively. The second control causes the measurement controller 129 to perform measurement after the measurement point list is changed. The third control causes the measurement controller 129 to perform measurement after the measurement sequence is changed. However, if assurance of a given measurement accuracy is of minor importance, the second control may be performed as long as the measurement distance 310B is smaller than the minimum measurement pitch.

Figure 3D:
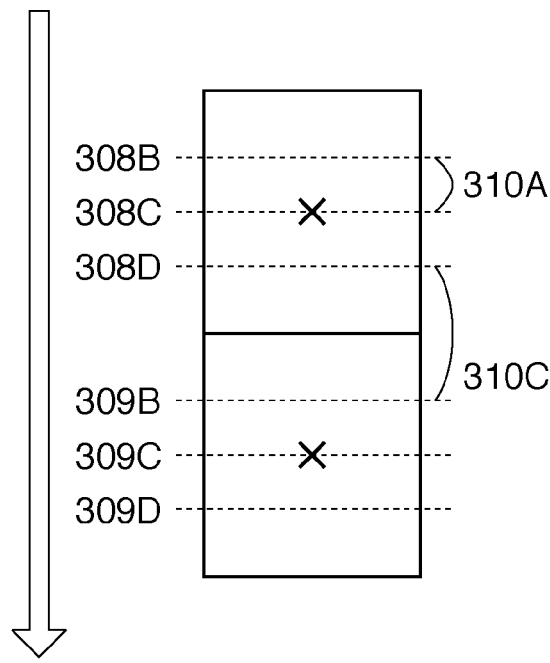
FIG. 3D is a view illustrating still other measurement points.

The second control is selected when a decrease in measurement accuracy falls within a tolerance. In the second control, a second measurement point list is generated by excluding measurement points, which form a pitch that falls within the minimum measurement pitch, from the first measurement point list. In this case, measurement is performed in accordance with a second measurement point list. More specifically, a second measurement point list can be generated by excluding, for example, the measurement points 308A, 308E, and 309A, and a measurement point 309E of the measurement points 308A to 308E and 309A to 309E in the shot regions 306 and 307. FIG. 3D schematically shows the thus generated second measurement point list. In the second measurement point list, a distance 310C between measurement points across successive shots is larger than the minimum measurement pitch and therefore allows measurement at these measurement points. A second measurement point list may also be generated by excluding, for example, the measurement points 308A and 309A or the measurement points 308E and 309E from the first measurement point list.

In the second control, a second measurement point list is generated as a measurement point list which allows the overall measurement. However, because the measurement pitch 310C is larger than the minimum measurement pitch in the second measurement point list, the measurement accuracy inevitably lowers.

The third control is selected when the focus accuracy required by a recipe is not satisfied in a method of changing the measurement points. In the third control, the substrate surface positions are measured at all measurement points included in the first measurement point list by a plurality of times of column measurement in each column. More specifically, the first column measurement is performed at the measurement points 308A to 308D and 309A to 309D, and thereafter the second column measurement is performed at the measurement points 308E and 309E. Since the measurement distance 310B is smaller than the measurement pitch 310A, high measurement accuracy can be ensured in that case.

In other words, the main controller 130 selects the second control in a mode in which shortening of the measurement time has priority over assurance of a given measurement accuracy, and selects the third control in a mode in which assurance of a given measurement accuracy has priority over shortening of the measurement time. The main controller 130 controls the scope (measurement device) 123 via the measurement controller 129 so as to perform measurement in accordance with the selected method.

Figure 4:
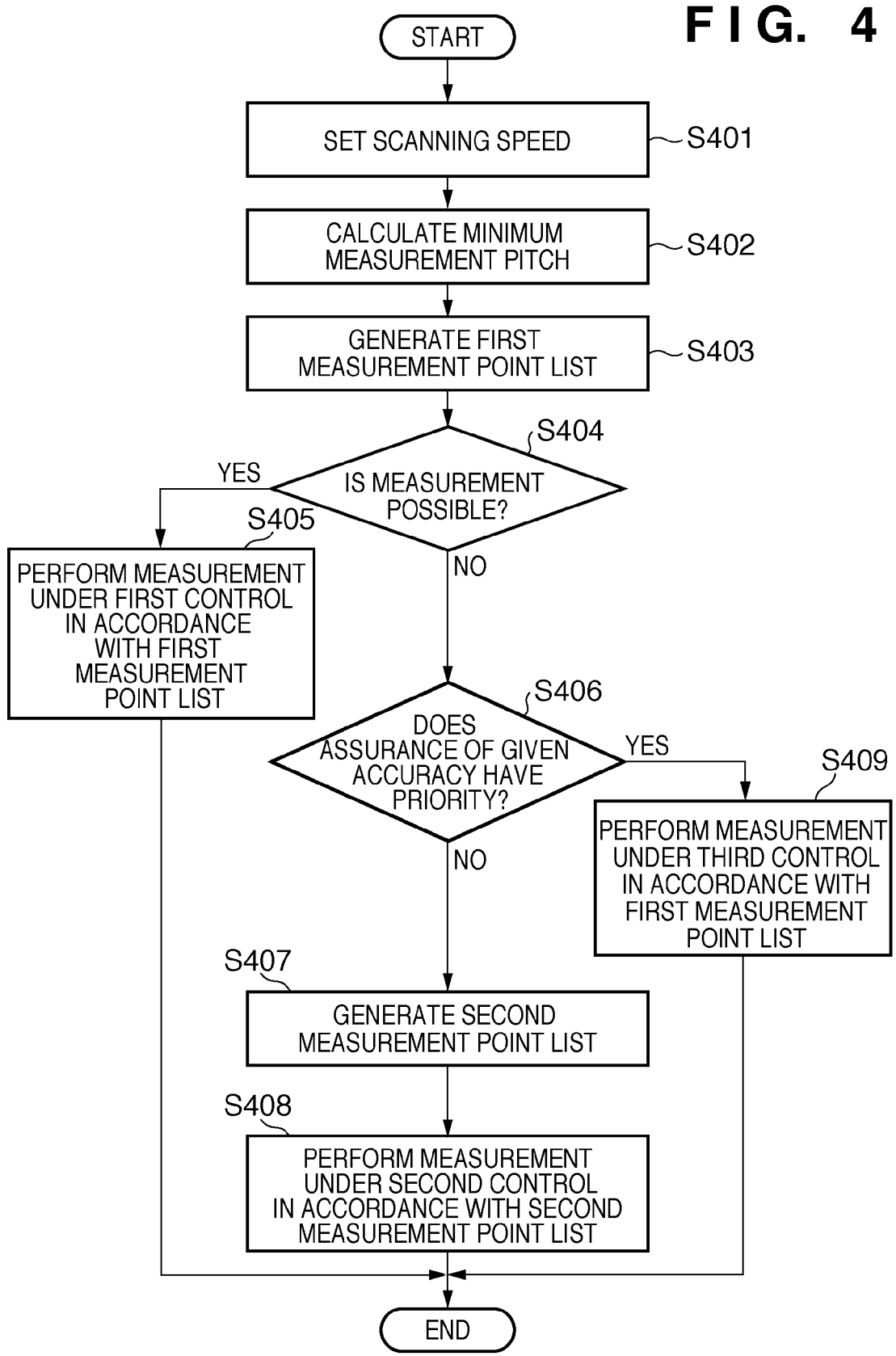
FIG. 4 is a flowchart schematically showing focus measurement (substrate surface position measurement) control by a main controller.
Figure 5A:
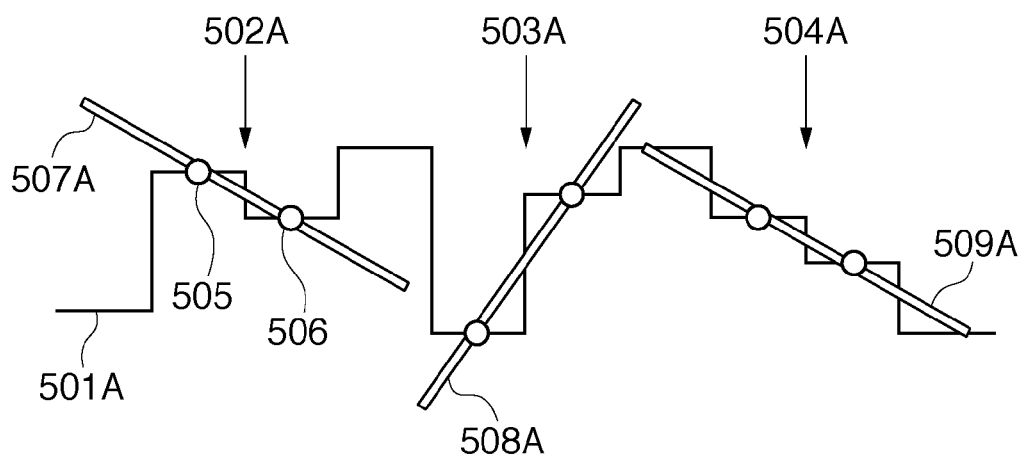
FIG. 5A is a view for explaining substrate surface shape measurement.
Figure 5B:
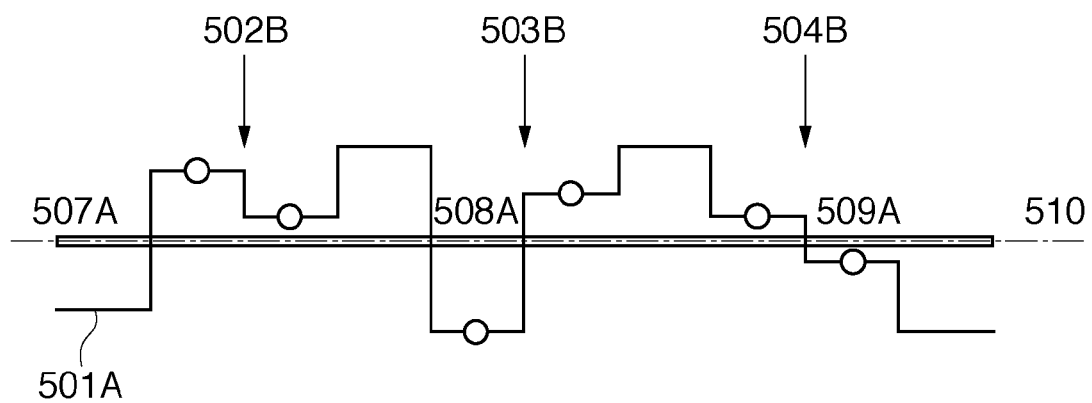
FIG. 5B is a view for explaining the substrate surface shape measurement.
Figure 5C:
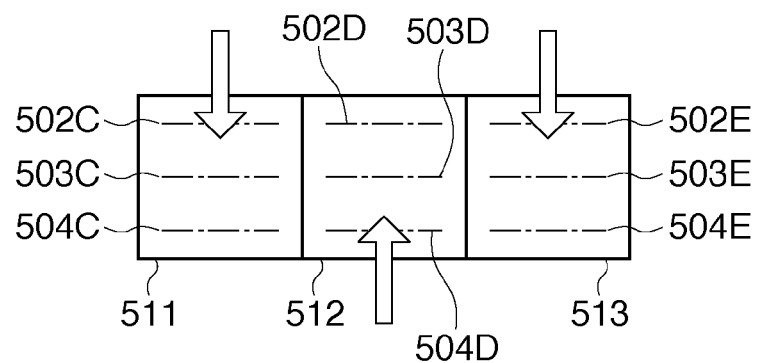
FIG. 5C is a view for explaining the substrate surface shape measurement.
Figure 5D:
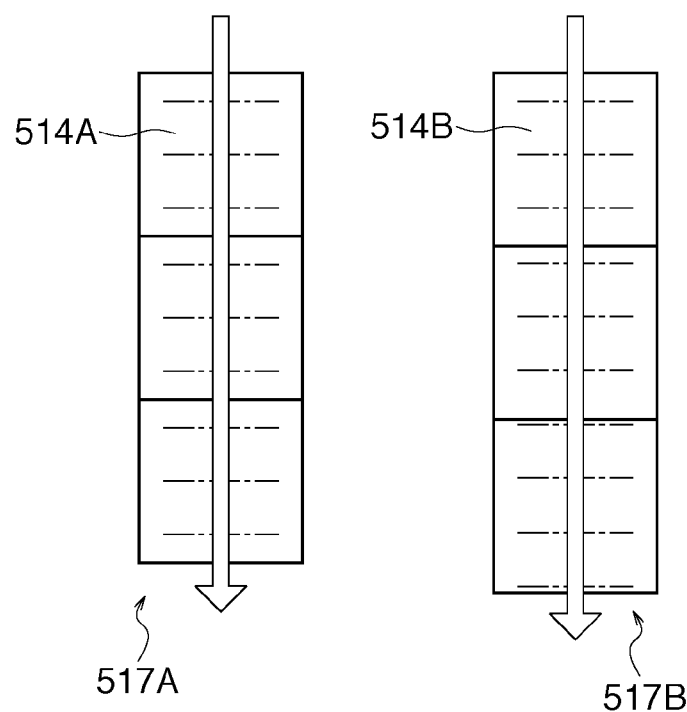
FIG. 5D is a view for explaining the substrate surface position measurement.

FIG. 4 is a flowchart schematically showing focus measurement (substrate surface position measurement) control by the main controller 130. First, in step S401, the main controller 130 sets the scanning speed. In step S402, the main controller 130 calculates a minimum measurement pitch based on the set scanning speed and a minimum sampling time interval unique to the exposure apparatus.

In step S403, the main controller 130 generates a first measurement point list including a plurality of measurement points. The first measurement point list means herein a list of measurement points located at the centers of respective shot regions, and measurement points located at a predetermined pitch to be symmetrical about these centers, both in a direction parallel to the substrate scanning direction.

In step S404, based on the shot size (the length of each shot region in the scanning direction), the main controller 130 determines whether the last measurement point in one shot region (the most downstream measurement point in the scanning direction or the measurement point, at which measurement is performed last in that shot region, of the measurement points arranged in that shot region), and the first measurement point in a shot region to be measured next (the most upstream measurement point in the scanning direction of the measurement points arranged in that shot region) can be measured successively. The last measurement point and the first measurement point adjacent to it will be referred to as the inter-shot adjacent measurement points hereinafter. Also, the distance between the last measurement point and the first measurement point adjacent to it will be referred to as the inter-shot measurement point distance (first distance) hereinafter.

The determination in step S404 is as to whether the measurement distance 310B mentioned above is larger than the minimum measurement pitch. If the main controller 130 determines that the inter-shot adjacent measurement points can be measured successively (if the measurement distance 310B is larger than the minimum measurement pitch) (YES in step S404), it advances the process to step S405; otherwise (NO in step S406), it advances the process to step S406.

In step S405, the main controller 130 causes the measurement controller 129 to perform measurement control (i.e., focus measurement control by the scope 123) by the first control in accordance with the first measurement point list. The process is then terminated.

In step S406, the main controller 130 determines whether a mode in which assurance of a given measurement accuracy has priority over shortening of the measurement time is set. If this mode is set (YES in step S406), the main controller 130 advances the process to step S409. On the other hand, if a mode in which shortening of the measurement time has priority over assurance of a given measurement accuracy is set (NO in step S406), the main controller 130 advances the process to step S407. If assurance of a given measurement accuracy is of minor importance herein, the main controller 130 may advance the process to step S407 when it determines in step S404 that the inter-shot adjacent measurement points cannot be measured successively.

In step S407, the main controller 130 generates a second measurement point list by processing the first measurement point list. The second measurement point list is obtained by excluding, from the first measurement point list, at least one of the last measurement point at which measurement is performed last in one shot region, and the first measurement point at which measurement is performed first in the next shot region.

In step S408, the main controller 130 causes the measurement controller 129 to perform measurement control (i.e., measurement by the scope 123) by the second control in accordance with the second measurement point list.

In step S409, the main controller 130 causes the measurement controller 129 to perform measurement control (i.e., focus measurement control by the scope 123) by the third control in accordance with the first measurement point list.

The second embodiment of the present invention is different from the first embodiment in the second measurement point list and the third control. Note that details which are not particularly referred to in the second embodiment can be the same as in the first embodiment.

Figure 6A:
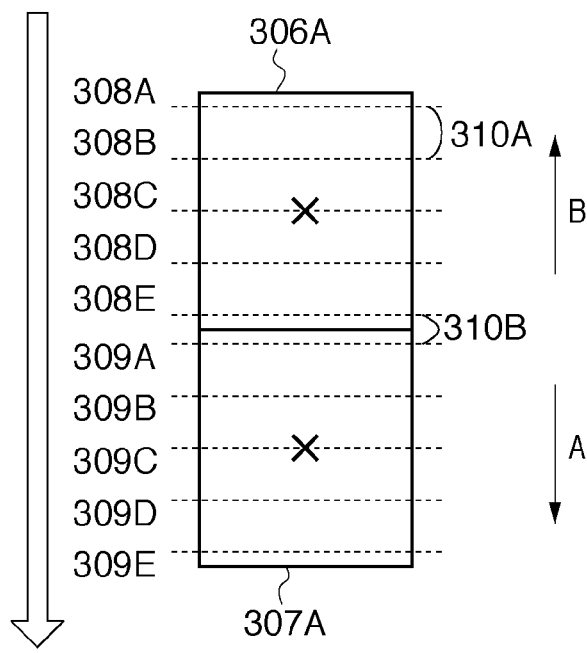
FIG. 6A is a view illustrating still other measurement points.
Figure 6B:
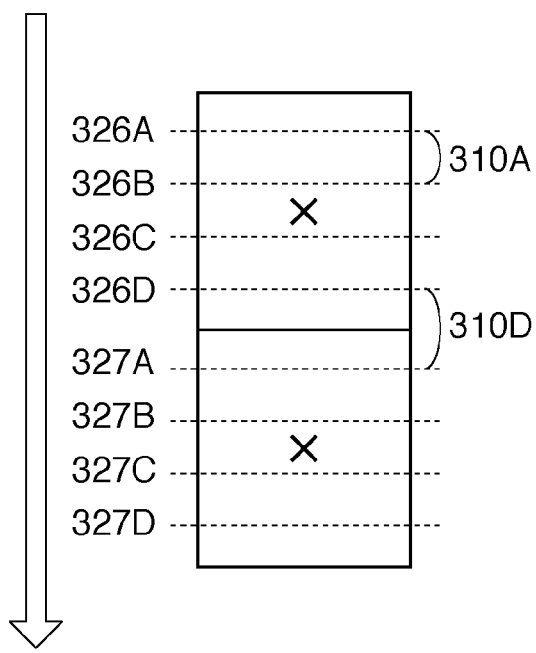
FIG. 6B is a view illustrating still other measurement points.

A second measurement point list generated in the second embodiment will be explained first with reference to FIGS. 6A and 6B. In the second measurement point list, of the measurement points in the first measurement point list, measurement points on the side of a first direction (on the side of a direction A in FIG. 6A) with respect to the center of a given shot region are moved in a second direction (a direction B in FIG. 6A) opposite to the first direction by half the minimum measurement pitch. In other words, measurement points 308D and 308E shown in FIG. 6A change to measurement points 326C and 326D shown in FIG. 6B upon this movement. Further, measurement points 309D and 309E shown in FIG. 6A change to measurement points 327C and 327D shown in FIG. 6B upon this movement.

In addition, in the second measurement point list, of the measurement points in the first measurement point list, measurement points on the side of the second direction (on the side of the direction B in FIG. 6A) with respect to the center of a given shot region are moved in the first direction (the direction A in FIG. 6A) by half the minimum measurement pitch. In other words, measurement points 308A and 308B shown in FIG. 6A change to measurement points 326A and 326B shown in FIG. 6A upon this movement. Further, measurement points 309A and 309B shown in FIG. 6A change to measurement points 327A and 327B shown in FIG. 6B upon this movement.

Furthermore, in the second measurement point list, a measurement point located at the center of a given shot region is excluded from the first measurement point list.

The inter-shot measurement point distance (first distance) in the second embodiment is larger than that in the first embodiment. Hence, a decrease in substrate measurement accuracy in the second control is relatively small in the second embodiment.

A fourth method in the second embodiment is performed in a mode in which the inter-shot measurement point distance is set to be smaller than the minimum measurement pitch, and assurance of a given measurement accuracy has priority over shortening of the measurement time.

Third control in the second embodiment changes the scanning speed during measurement so that the measurement pitch becomes uniform, thereby adjusting the minimum measurement pitch in accordance with the size of each shot region. Shot regions 306A and 306B are assumed to have the same size, and shot regions 307A and 307B are assumed to have the same size. In column measurement of each shot region, a measurement pitch 310A can be reduced to a measurement pitch 305A by slowing down the scanning speed during measurement. At this time, when the scanning speed is determined such that an inter-shot measurement point distance 305B across the shot regions 306B and 307B is equal to the measurement pitch 305A, it is possible to obtain high measurement accuracy although the productivity lowers in this case.

Scanning velocity determination will be explained below. First, a condition described by:

$$\mathrm{Mod}(L, P) = Pedge$$

$$P = Pedge$$

$$P = \tau 0 \times V$$

is set, where Mod(a, b) is the remainder when a is divided by b, L is the length of each shot region in the scanning direction, P is the measurement pitch at the scanning velocity V, Pedge is the inter-shot measurement point distance, $\tau 0$ is the processing time in a measurement controller 129, and V is the scanning velocity during focus measurement.

Calculating a maximum scanning velocity V under this condition makes it possible to determine a scanning velocity V at which high measurement accuracy is obtained while a decrease in productivity is suppressed. In this case, the scanning velocity V is discrete, as a matter of course. However, when assurance of a given accuracy is of prime importance, a scanning velocity that is the second highest of those which satisfy the above-mentioned condition is suitably selected.

FIG. 7 is a flowchart schematically showing focus measurement control by a main controller 130. The same reference numerals as in FIG. 4 denote the same processes in FIG. 7. In step S407, a second measurement point list, as mentioned above, according to the second embodiment is generated. In step S701, the main controller 130 controls the measurement controller 129 to perform focus measurement by the above-mentioned third control, i.e., by slowing down the scanning speed as compared with that in the first control.

A method of manufacturing devices (e.g., a semiconductor device and a liquid crystal display device) according to one embodiment of the present invention will be explained next.

A semiconductor device is manufactured by a preprocess of forming an integrated circuit on a wafer (semiconductor substrate), and a post-process of completing, as a product, a chip of the integrated circuit formed on the wafer by the preprocess. The preprocess can include a step of exposing a wafer coated with a photosensitive agent using the above-mentioned exposure apparatus, and a step of developing the wafer. The post-process can include an assembly step (dicing and bonding) and packaging step (encapsulation). Also, a liquid crystal display device is manufactured by a step of forming a transparent electrode. The step of forming a transparent electrode can include a step of coating a glass substrate, on which a transparent conductive film is deposited, with a photosensitive agent, a step of exposing the glass substrate coated with the photosensitive agent using the above-mentioned exposure apparatus, and a step of developing the glass substrate.

Although several embodiments of the present invention have been described above, the present invention is not limited to these embodiments, and various modifications and changes can be made without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-292606, filed Nov. 14, 2008, which is hereby incorporated by reference herein in its entirety.

What is claimed is:

1. An apparatus which includes a projection optical system, a stage configured to hold a substrate, and a measurement device configured to measure a position of a surface of the substrate in a direction of an optical axis of the projection optical system; measures the position with respect to each of a plurality of shot regions on the substrate by successively scanning in one scanning direction the plurality of shot regions relative to the measurement device, the plurality of shot regions being arrayed along the scanning direction; and moves the stage in accordance with the measured position and exposes each of the plurality of shot regions to a pattern via the projection optical system, the apparatus comprising:

a controller configured to control the stage and the measurement device, wherein the controller is configured to generate a list of measurement points arranged, with respect to each of the plurality of shot regions, symmetrically with respect to a center of a shot region along the scanning direction at a predetermined pitch, and a control of the measurement device by the controller includes a first control which causes the measurement device to measure the position with respect to each of the measurement points included in the list, and a second control which causes the measurement device to measure the position with respect to each of measurement points to be obtained by excluding, from the list, at least one of a last measurement point with respect to which measurement is performed last in a first shot region and a first measurement point with respect to which measurement is performed first in a second shot region next to the first shot region, wherein the controller is configured to perform the first control if, in the list, a distance between the last measurement point in the first shot region and the first measurement point in the second shot region is not smaller than the predetermined pitch, and to perform the second control if at least, in the list, the distance is smaller than the predetermined pitch.

2. The apparatus according to claim 1, wherein the control of the measurement device by the controller includes a third control which causes the measurement device to measure the positions with respect to all measurement points included in the list by scanning the substrate a plurality of times, and the controller is configured to perform the second control if, in the list, the distance is smaller than the predetermined pitch, and a mode is set in which a measurement time saving has higher priority than a measurement accuracy has, and perform the third control if, in the list, the distance is smaller than the predetermined pitch, and a mode is set in which a measurement accuracy has higher priority than a measurement time saving has.

3. A method comprising:

exposing a substrate to a pattern using an apparatus;

developing the exposed substrate; and processing the developed substrate to manufacture a device, wherein the apparatus includes a projection optical system, a stage configured to hold the substrate, and a measurement device configured to measure a position of a surface of the substrate in a direction of an optical axis of the projection optical system; measures the position with respect to each of a plurality of shot regions on the substrate by successively scanning in one scanning direction the plurality of shot regions relative to the measurement device, the plurality of shot regions being arrayed along the scanning direction; and moves the stage in accordance with the measured position and exposes each of the plurality of shot regions to the pattern via the projection optical system, the apparatus including:

a controller configured to control the stage and the measurement device, wherein the controller is configured to generate a list of measurement points arranged, with respect to each of the plurality of shot regions, symmetrically with respect to a center of a shot region along the scanning direction at a predetermined pitch, and a control of the measurement device by the controller includes a first control which causes the measurement device to measure the position with respect to each of the measurement points included in the list, and a second control which causes the measurement device to measure the position with respect to each of measurement points to be obtained by excluding, from the list, at least one of a last measurement point with respect to which measurement is performed last in a first shot region and a first measurement point with respect to which measurement is performed first in a second shot region next to the first shot region, wherein the controller is configured to perform the first control if, in the list, a distance between the last measurement point in the first shot region and the first measurement point in the second shot region is not smaller than the predetermined pitch, and to perform the second control if at least, in the list, the distance is smaller than the predetermined pitch.

* * * * *